(12) United States Patent
Kim et al.

(10) Patent No.: US 10,990,522 B2
(45) Date of Patent: Apr. 27, 2021

(54) ELECTRONIC DEVICES RELATING TO A MODE REGISTER INFORMATION SIGNAL

(71) Applicant: SK hynix Inc., Icheon-si (KR)

(72) Inventors: Chang Hyun Kim, Seoul (KR); Dong Kyun Kim, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 185 days.

(21) Appl. No.: 15/893,004

(22) Filed: Feb. 9, 2018

(65) Prior Publication Data

US 2019/0073299 A1   Mar. 7, 2019

(30) Foreign Application Priority Data

Sep. 4, 2017   (KR) .................. 10-2017-0112712

(51) Int. Cl.
| | | |
|---|---|---|
| *G06F 12/06* | (2006.01) | |
| *G06F 13/16* | (2006.01) | |
| *G11C 7/10* | (2006.01) | |
| *G11C 7/00* | (2006.01) | |
| *G11C 8/06* | (2006.01) | |
| *G11C 8/18* | (2006.01) | |

(52) U.S. Cl.
CPC .............. *G06F 12/06* (2013.01); *G06F 13/16* (2013.01); *G11C 7/00* (2013.01); *G11C 7/1015* (2013.01); *G11C 8/06* (2013.01); *G11C 8/18* (2013.01)

(58) Field of Classification Search
CPC ........................................................ G06F 12/06
See application file for complete search history.

(56) References Cited

U.S. PATENT DOCUMENTS

| | | | |
|---|---|---|---|
| 2012/0294060 A1* | 11/2012 | Ohshima | G11C 11/005 365/72 |
| 2014/0181588 A1* | 6/2014 | Gil | G11C 29/36 714/37 |
| 2015/0262631 A1* | 9/2015 | Shimizu | G11C 7/1072 711/105 |

FOREIGN PATENT DOCUMENTS

KR       1020150067539 A       6/2015

* cited by examiner

*Primary Examiner* — Charles Rones
*Assistant Examiner* — Han V Doan
(74) *Attorney, Agent, or Firm* — William Park & Associates Ltd.

(57) ABSTRACT

An electronic device may include an information signal storage circuit and a write data selection circuit. The information signal storage circuit may be configured to store an information signal during a mode register set operation, and may be configured to output the stored information signal as a mode register information signal. The write data selection circuit may be configured to receive the mode register information and output the mode register information signal as write data.

18 Claims, 8 Drawing Sheets

ELECTRONIC DEVICES RELATING TO A MODE REGISTER INFORMATION SIGNAL

CROSS-REFERENCE TO RELATED APPLICATIONS

The present application claims priority under 35 U.S.C 119(a) to Korean Application No. 10-2017-0112712, filed on Sep. 4, 2017, which is incorporated herein by references in its entirety.

BACKGROUND

1. Technical Field

Embodiments of the present disclosure generally relate to electronic devices relating to a mode register information signal.

2. Related Art

Each electronic device may include registers for storing information, for example, mode information may be stored for executing internal operations of the electronic device. The mode information necessary for executing the internal operations of the electronic device may include latency information on a column address strobe (CAS) latency and data information on a burst length. While an initialization operation such as a booting operation of the electronic device is performed, the electronic device may execute a mode register set (MRS) operation to store the mode information into a register of the electronic device.

SUMMARY

According to an embodiment, an electronic device may be provided. The electronic device may include an information signal storage circuit configured to store an information signal during a mode register set operation, and configured to output the stored information signal as a mode register information signal. The electronic device may include a write data selection circuit configured to receive the mode register information and output the mode register information signal as write data. The electronic device may include a cell array configured to store the write data. During a first mode operation, the write data selection circuit receives the mode register information signal, outputs the mode register information signal as the write data to the cell array, and the cell array stores the write data.

According to an embodiment, an electronic device may be provided. The electronic device may include a write data selection circuit configured to generate write data from input data or a mode register information signal based on a first selection signal. The electronic device may include a cell array configured to receive the write data from the write data selection circuit and store the write data within the cell array. The electronic device may include a selection information signal generation circuit configured to generate a selection information signal from read data outputted from the cell array or an information signal based on a second selection signal. The mode register information signal may be generated from the selection information signal.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

For reference, an embodiment including additional components may be provided. Furthermore, an active high or active low configuration indicating an active state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations. Further, the logic levels of the signals may be different from or the opposite of those described. For example, a signal described as having a logic "high" level may alternatively have a logic "low" level, and a signal described as having a logic "low" level may alternatively have a logic "high" level.

Figure 1:
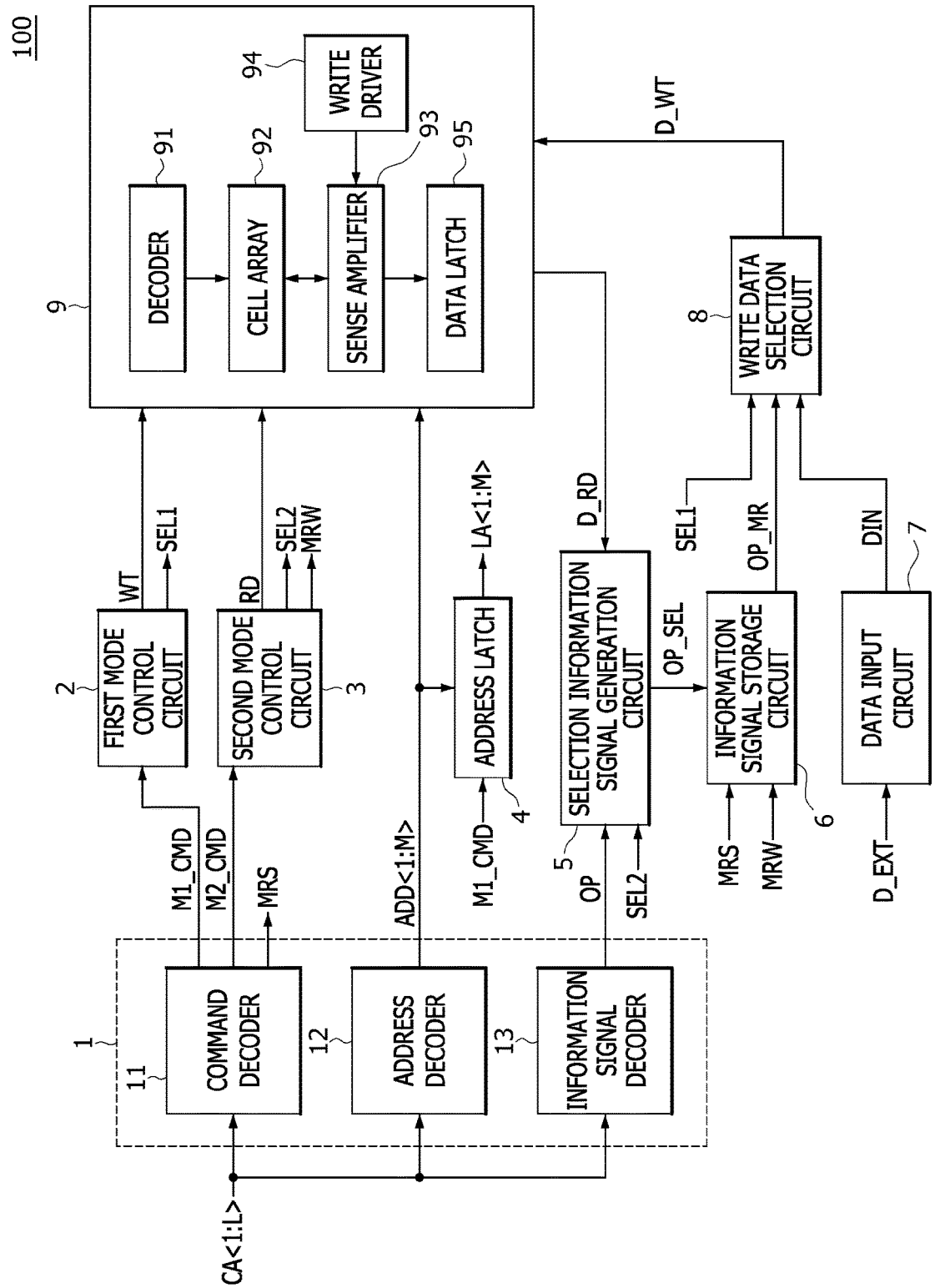
FIG. 1 is a block diagram illustrating a configuration of an electronic device according to an embodiment of the present disclosure.

Referring to FIG. 1, an electronic device 100 according to an embodiment may include a decoder circuit 1, a first mode control circuit 2, a second mode control circuit 3, an address latch 4, a selection information signal generation circuit 5, an information signal storage circuit 6, a data input circuit 7, a write data selection circuit 8, and a core circuit 9.

The decoder circuit 1 may include a command decoder 11, an address decoder 12 and an information signal decoder 13. The command decoder 11 may decode an external control signal CA<1:L> to generate a first mode command M1_CMD, a second mode command M2_CMD and a mode register set command MRS. The external control signal CA<1:L> may include a command and an address. The number "L" of bits included in the external control signal CA<1:L> may be set to be different according to the embodiments. The first mode command M1_CMD may be generated to perform a first mode operation for storing a mode register information signal OP_MR stored in the information signal storage circuit 6 into a cell array 92 of the core circuit 9. The second mode command M2_CMD may be generated to perform a second mode operation for storing information stored in the cell array 92 of the core circuit 9 into the information signal storage circuit 6. The mode register set command MRS may be generated to perform a mode register set operation for storing an information signal OP, generated by decoding the external control signal CA<1:

L>, into the information signal storage circuit 6. In an embodiment, for example, mode register set operation may include storing a selection information signal OP_SEL including the information signal OP which is generated by decoding an external control signal CA<1:L>. The address decoder 12 may decode the external control signal CA<1:L> to generate an address signal ADD<1:M> having various address combinations. The various address combinations of the address signal ADD<1:M> may correspond to various logic level combinations of bits included in the address signal ADD<1:M>. The number "M" of bits included in the address signal ADD<1:M> may be set to be different according to the embodiments. The information signal decoder 13 may decode the external control signal CA<1:L> to generate the information signal OP.

The first mode control circuit 2 may generate a write signal WT and a first selection signal SEL1 in response to the first mode command M1_CMD. In an embodiment, for example, the first selection signal SEL1 may be enabled during a first mode operation. The first mode control circuit 2 may generate the write signal WT and the first selection signal SEL1 which are enabled if the first mode command M1_CMD is generated. The write signal WT may be enabled to perform a write operation for storing write data D_WT into the cell array 92. In an embodiment, for example, the write data D_WT s generated from the mode register information signal OP_MR and is stored into the cell array 92 if the first mode operation is performed. The first selection signal SEL1 may be enabled to select the mode register information signal OP_MR stored in the information signal storage circuit 6 as the write data D_WT.

The second mode control circuit 3 may generate a read signal RD, a second selection signal SEL2 and a mode register write signal MRW in response to the second mode command M2_CMD. The second mode control circuit 3 may generate the read signal RD, the second selection signal SEL2 and the mode register write signal MRW which are enabled if the second mode command M2_CMD is generated. The read signal RD may be enabled to perform a read operation for outputting information stored in the cell array 92 as read data D_RD. The second selection signal SEL2 may be enabled to select the read data D_RD as a selection information signal OP_SEL. In an embodiment, the second selection signal SEL2 is enabled during a second mode operation.

The address latch 4 may generate a latch address LA<1:M> from the address signal ADD<1:M> in response to the first mode command M1_CMD. The address latch 4 may latch the address signal ADD<1:M> to output the latched address signal as the latch address LA<1:M>, if the first mode command M1_CMD is generated. If the first mode operation is performed, the latch address LA<1:M> outputted from the address latch 4 may be transmitted to and stored into a frequency information storage circuit (1500 of FIG. 8). A configuration and an operation of the address latch 4 will be described with reference to FIG. 2 later.

The selection information signal generation circuit 5 may generate the selection information signal OP_SEL from the information signal OP or the read data D_RD in response to the second selection signal SEL2. The selection information signal generation circuit 5 may selectively output the information signal OP as the selection information signal OP_SEL while the second selection signal SEL2 is disabled. The selection information signal generation circuit 5 may selectively output the read data D_RD as the selection information signal OP_SEL while the second selection signal SEL2 is enabled. A configuration and an operation of the selection information signal generation circuit 5 will be described with reference to FIG. 3 later.

The information signal storage circuit 6 may generate the mode register information signal OP_MR from the selection information signal OP_SEL in response to the mode register set command MRS and the mode register write signal MRW. The information signal storage circuit 6 may store the selection information signal OP_SEL and may output the stored selection information signal as the mode register information signal OP_MR, if the mode register set command MRS is generated. The information signal storage circuit 6 may store the selection information signal OP_SEL and may output the stored selection information signal as the mode register information signal OP_MR, if the mode register write signal MRW is enabled. A configuration and an operation of the information signal storage circuit 6 will be described with reference to FIG. 4 later.

The data input circuit 7 may generate input data DIN from external data D_EXT. The data input circuit 7 may include a buffer and a latch. The data input circuit 7 may buffer or latch the external data D_EXT to generate the input data DIN.

The write data selection circuit 8 may generate the write data D_WT from the input data DIN or the mode register information signal OP_MR in response to the first selection signal SEL1. The write data selection circuit 8 may selectively output the input data DIN as the write data D_WT if the first selection signal SEL1 is disabled. The write data selection circuit 8 may selectively output the mode register information signal OP_MR as the write data D_WT if the first selection signal SEL1 is enabled. A configuration and an operation of the write data selection circuit 8 will be described with reference to FIG. 5 later.

The core circuit 9 may include a decoder 91, a cell array 92, a sense amplifier 93, a write driver 94 and a data latch 95. The decoder 91 may decode the address signal ADD<1:M> to select at least one of cells included in the cell array 92. At least one of the cells included in the cell array 92 may correspond to any one of address combinations of the address signal ADD<1:M>. The write driver 94 may control the sense amplifier 93 to store the write data D_WT into the cells included in the cell array 92 during the write operation. The data latch 95 may receive data stored in the cells, which are included in the cell array 92 and are selected by the address signal ADD<1:M>, through the sense amplifier 93 and may output the data stored in the selected cells as the read data D_RD during the read operation.

Figure 2:
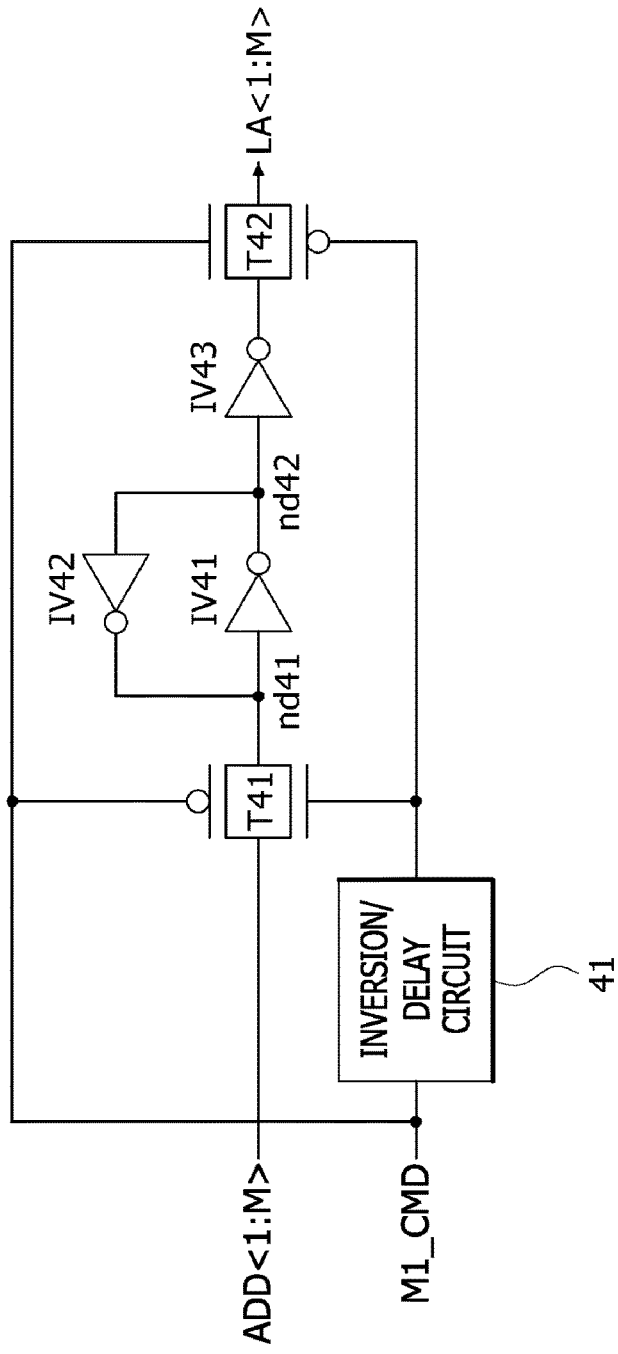
FIG. 2 is a circuit diagram illustrating an example of an address latch included in the electronic device of FIG. 1.

Referring to FIG. 2, the address latch 4 may include an inversion and delay (inversion/delay) circuit 41, transfer gates T41 and T42, and inverters IV41, IV42 and IV43. The inversion/delay circuit 41 may invert and delay the first mode command M1_CMD to output the inverted and delayed first mode command. The transfer gates T41 and T42 may be turned on according to a logic level of the first mode command M1_CMD. For example, if the first mode command M1_CMD is generated to have a logic "high" level, the transfer gate T41 and the transfer gate T42 may be respectively turned off and turned on in synchronization with a point of time that a delay time of the inversion/delay circuit 41 elapses from a point of time that the first mode command M1_CMD is generated to have a logic "high" level. The inverters IV41 and IV42 may constitute a latch circuit for latching signals of nodes nd41 and nd42. The inverter IV43 may inversely buffer a signal of the node nd42 to output the inversely buffered signal as the latch address LA<1:M>. The address latch 4 may latch the address signal ADD<1:M> using the inverters IV41 and IV42 at a point of time that the first mode command M1_CMD is generated and may inversely buffer a signal of the node nd42 using the inverter IV43 to output the inversely buffered signal as the latch address LA<1:M> at a point of time that a delay time of the inversion/delay circuit 41 elapses from a point of time that the first mode command M1_CMD is generated.

Figure 3:
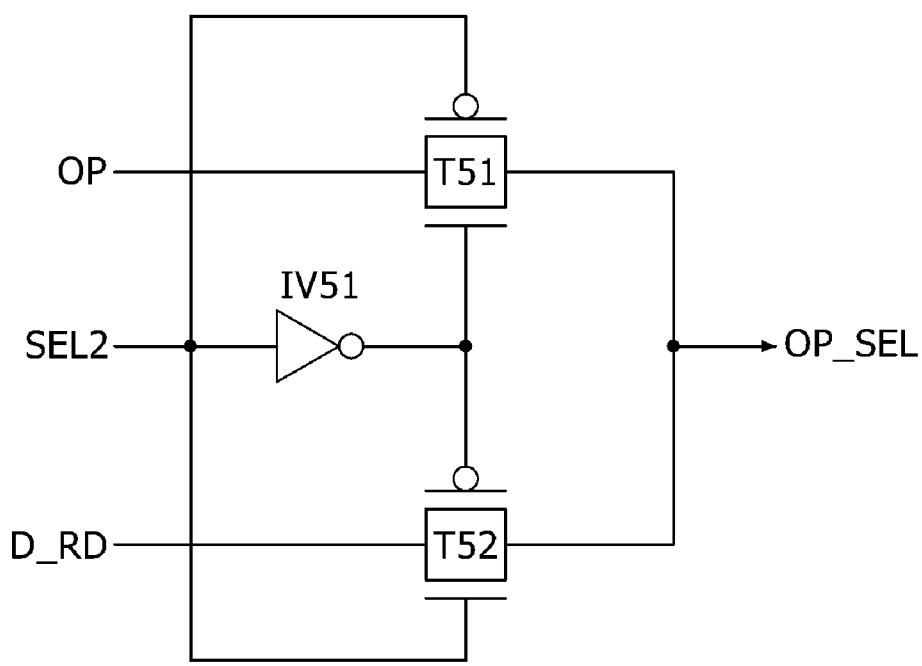
FIG. 3 is a circuit diagram illustrating an example of a selection information signal generation circuit included in the electronic device of FIG. 1.

Referring to FIG. 3, the selection information signal generation circuit 5 may include an inverter IV51 and transfer gates T51 and T52. The inverter IV51 may inversely buffer the second selection signal SEL2 to output the inversely buffered signal as an output signal of the inverter IV51. The selection information signal generation circuit 5 may selectively output the information signal OP as the selection information signal OP_SEL through the transfer gate T51 which is turned on while the second selection signal SEL2 is disabled to have a logic "low" level. In an embodiment, for example, the selection information signal OP_SEL is generated from the information signal OP during the first mode operation. The selection information signal generation circuit 5 may selectively output the read data D_RD as the selection information signal OP_SEL through the transfer gate T52 which is turned on while the second selection signal SEL2 is enabled to have a logic "high" level. In an embodiment, for example, the selection information signal OP_SEL is generated from read data D_RD during a second mode operation for outputting data stored in the cell array 92 as the read data D_RD.

Figure 4:
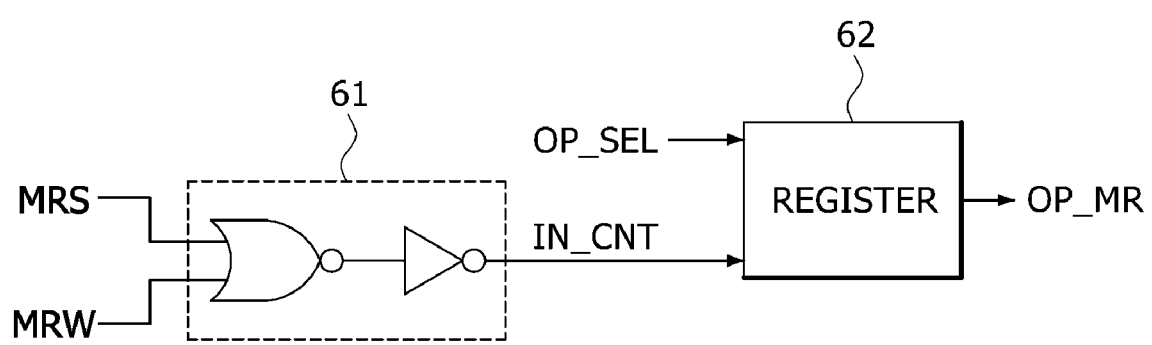
FIG. 4 is a circuit diagram illustrating an example of an information signal storage circuit included in the electronic device of FIG. 1.

Referring to FIG. 4, the information signal storage circuit 6 may include an internal control signal generation circuit 61 and a register 62. The internal control signal generation circuit 61 may receive the mode register set command MRS and the mode register write signal MRW and may perform a logical OR operation of the mode register set command MRS and the mode register write signal MRW to generate an internal control signal IN_CNT. In an embodiment, for example, the internal control signal control signal generation circuit 61 may include a NOR gate configured to receive the mode register set command MRS and the mode register write signal MRW and output a resultant signal to an inverter to output the internal control signal IN_CNTT. The internal control signal generation circuit 61 may generate the internal control signal IN_CNT which is enabled to have a logic "high" level if the mode register set command MRS is generated to have a logic "high" level or the mode register write signal MRW is enabled to have a logic "high" level. The register 62 may store the selection information signal OP_SEL if the internal control signal IN_CNT is enabled to have a logic "high" level. The register 62 may output the selection information signal OP_SEL stored therein as the mode register information signal OP_MR.

Figure 5:
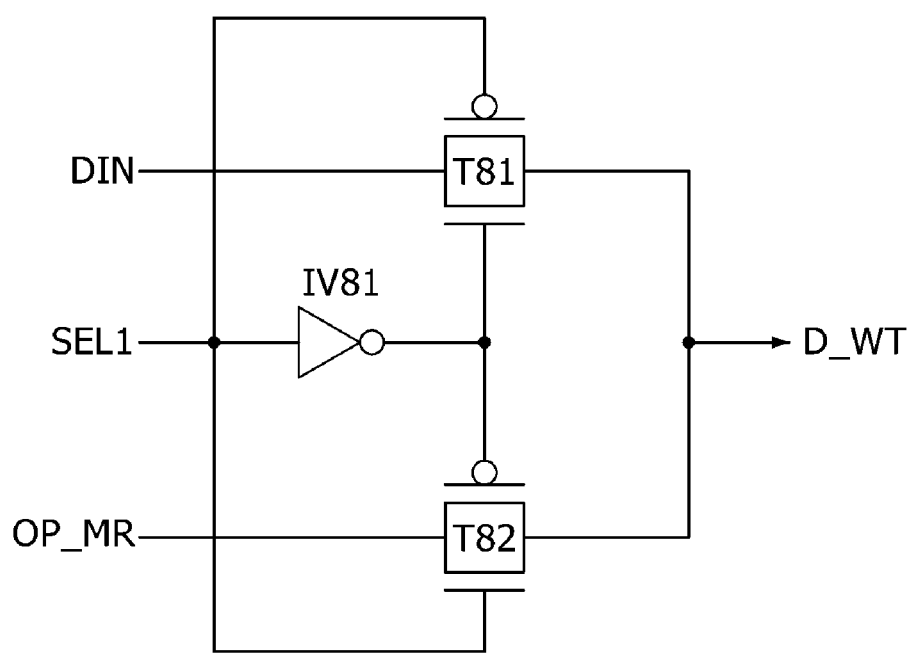
FIG. 5 is a circuit diagram illustrating an example of a write data selection circuit included in the electronic device of FIG. 1.

Referring to FIG. 5, the write data selection circuit 8 may include an inverter IV81 and transfer gates T81 and T82. The inverter IV81 may inversely buffer the first selection signal SEL1 to output the inversely buffered signal as an output signal of the inverter IV81. The write data selection circuit 8 may selectively output the input data DIN as the write data D_WT through the transfer gate T81 which is turned on while the first selection signal SEL1 is disabled to have a logic "low" level. The write data selection circuit 8 may selectively output the mode register information signal OP_MR as the write data D_WT through the transfer gate T82 which is turned on while the first selection signal SEL1 is enabled to have a logic "high" level.

Figure 6:
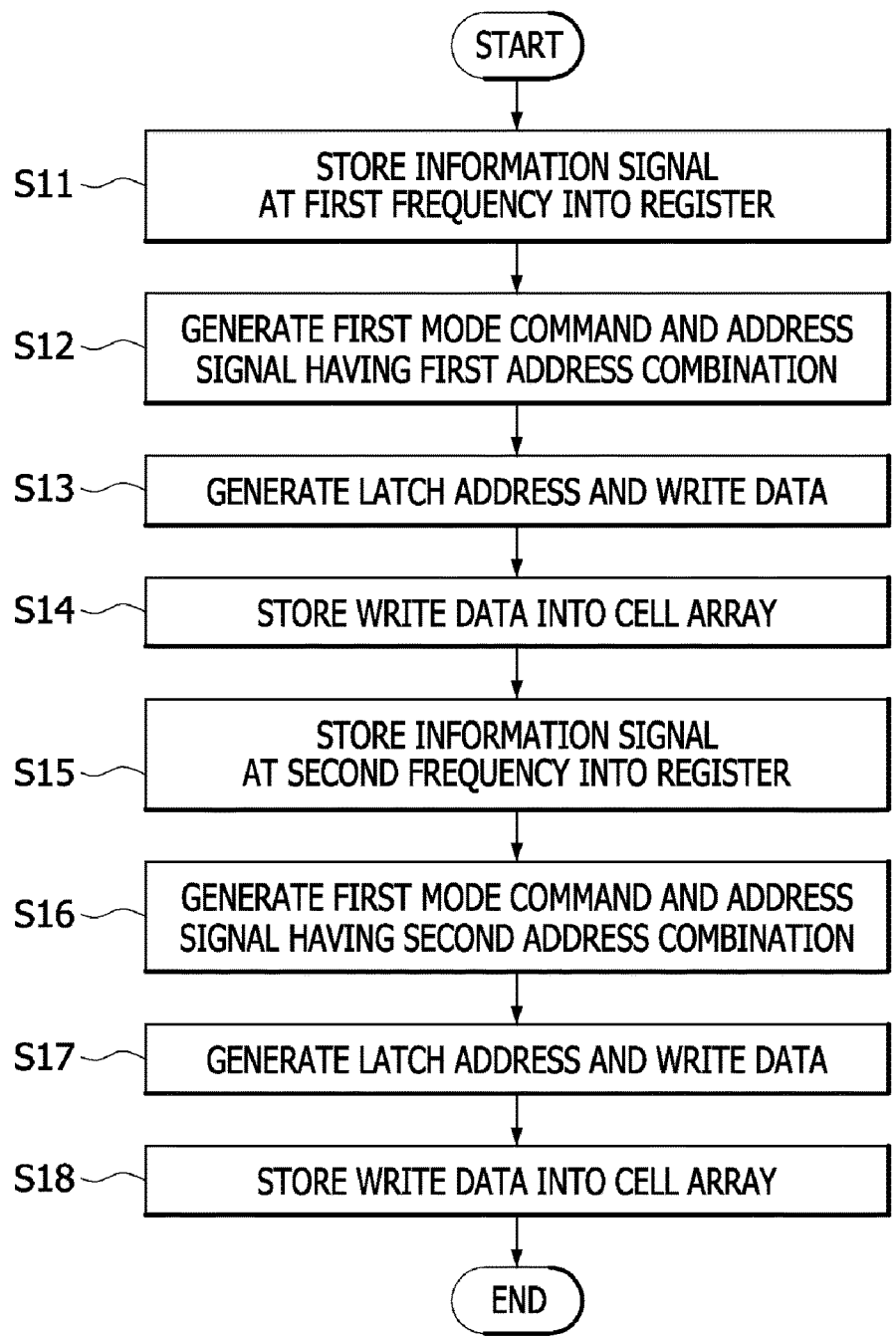
FIGS. 6 and 7 are flowcharts illustrating operations of the electronic device illustrated in FIGS. 1 to 5.

The first mode operation of the electronic device 100 having an aforementioned configuration will be described hereinafter with reference to FIG. 6.

First, the mode register set operation may be performed to store the information signal OP including mode information at a first frequency into the register 62 included in the information signal storage circuit 6 (see a step S11). The information signal OP may include latency information and data information that are necessary for an internal operation of the electronic device 100 when the electronic device 100 operates at the first frequency.

Next, the first mode command M1_CMD may be generated and the address signal ADD<1:M> having a first address combination may be generated (see a step S12). If the first mode command M1_CMD is generated, the first selection signal SEL1 may be enabled. In such a case, the mode register information signal OP_MR stored in the register 62 may be provided as the write data D_WT by the first selection signal SEL1 which is enabled, and the address signal ADD<1:M> having the first address combination may be provided as the latch address LA<1:M> by the first mode command M1_CMD (see a step S13).

Next, if the first mode command M1_CMD is generated, the write signal WT may also be enabled. In such a case, the write data D_WT may be stored into the cell array 92 by the write signal WT which is enabled (see a step S14). The write data D_WT may be stored into cells which are included in the cell array 92 and are selected by the address signal ADD<1:M> having the first address combination.

Next, the mode register set operation may be performed to store the information signal OP including mode information at a second frequency into the register 62 included in the information signal storage circuit 6 (see a step S15). The information signal OP may include latency information and data information that are necessary for an internal operation of the electronic device 100 when the electronic device 100 operates at the second frequency.

Next, the first mode command M1_CMD may be generated and the address signal ADD<1:M> having a second address combination may be generated (see a step S16). If the first mode command M1_CMD is generated, the first selection signal SEL1 may be enabled. In such a case, the mode register information signal OP_MR stored in the register 62 may be provided as the write data D_WT by the first selection signal SEL1 which is enabled, and the address signal ADD<1:M> having the second address combination may be provided as the latch address LA<1:M> by the first mode command M1_CMD (see a step S17).

Next, if the first mode command M1_CMD is generated, the write signal WT may also be enabled. In such a case, the write data D_WT may be stored into the cell array 92 by the write signal WT which is enabled (see a step S18). The write data D_WT may be stored into cells which are included in the cell array 92 and are selected by the address signal ADD<1:M> having the second address combination.

Figure 7:
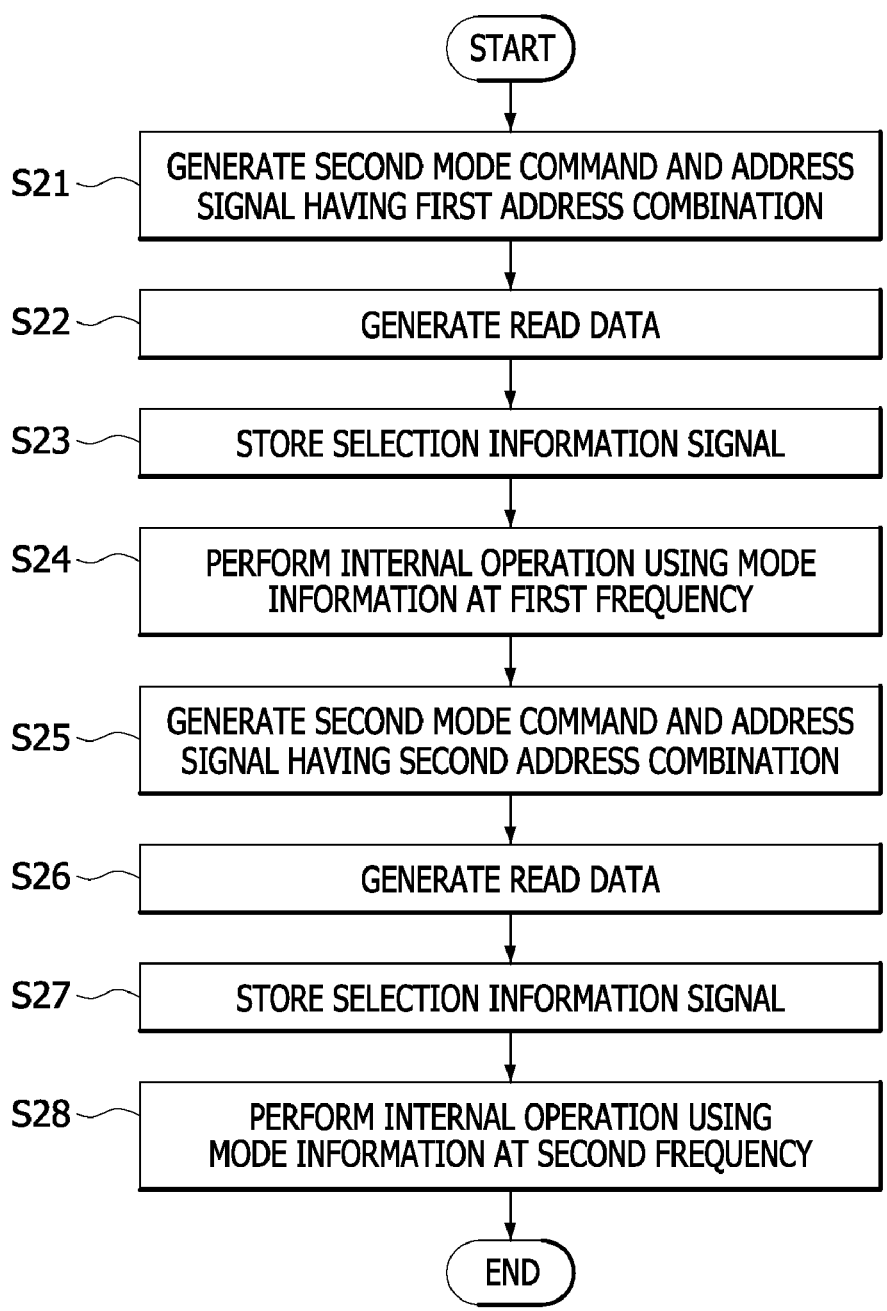

The second mode operation of the electronic device 100 having an aforementioned configuration will be described hereinafter with reference to FIG. 7.

First, the second mode command M2_CMD and the address signal ADD<1:M> having a first address combination may be generated in order that the electronic device 100 performs an internal operation at a first frequency (see a step S21). If the second mode command M2_CMD is generated, the read signal RD may be enabled. In such a case, data stored in cells, which are included in the cell array 92 and are selected by the address signal ADD<1:M> having the first address combination, may be outputted as the read data D_RD by the read signal RD which is enabled (see a step S22).

Next, if the second mode command M2_CMD is generated, the second selection signal SEL2 may be enabled. In such a case, the read data D_RD may be stored into the selection information signal generation circuit 5 and may be outputted as the selection information signal OP_SEL by the second selection signal SEL2 which is enabled (see a step S23).

Next, the selection information signal OP_SEL may be stored into the register 62 included in the information signal storage circuit 6 and may be outputted as the mode register information signal OP_MR. The mode register information signal OP_MR may include mode information at the first frequency. The electronic device 100 may perform the internal operation at the first frequency using the mode information which is included in the mode register information signal OP_MR (see a step S24).

Next, the second mode command M2_CMD and the address signal ADD<1:M> having a second address combination may be generated in order that the electronic device 100 performs an internal operation at a second frequency (see a step S25). If the second mode command M2_CMD is generated, the read signal RD may be enabled. In such a case, data stored in cells, which are included in the cell array 92 and are selected by the address signal ADD<1:M> having the second address combination, may be outputted as the read data D_RD by the read signal RD which is enabled (see a step S26).

Next, if the second mode command M2_CMD is generated, the second selection signal SEL2 may be enabled. In such a case, the read data D_RD may be stored into the selection information signal generation circuit 5 and may be outputted as the selection information signal OP_SEL by the second selection signal SEL2 which is enabled (see a step S27).

Next, the selection information signal OP_SEL may be stored into the register 62 included in the information signal storage circuit 6 and may be outputted as the mode register information signal OP_MR. The mode register information signal OP_MR may include mode information at the second frequency. The electronic device 100 may perform an internal operation at the second frequency using the mode information which is included in the mode register information signal OP_MR (see a step S28).

Figure 8:
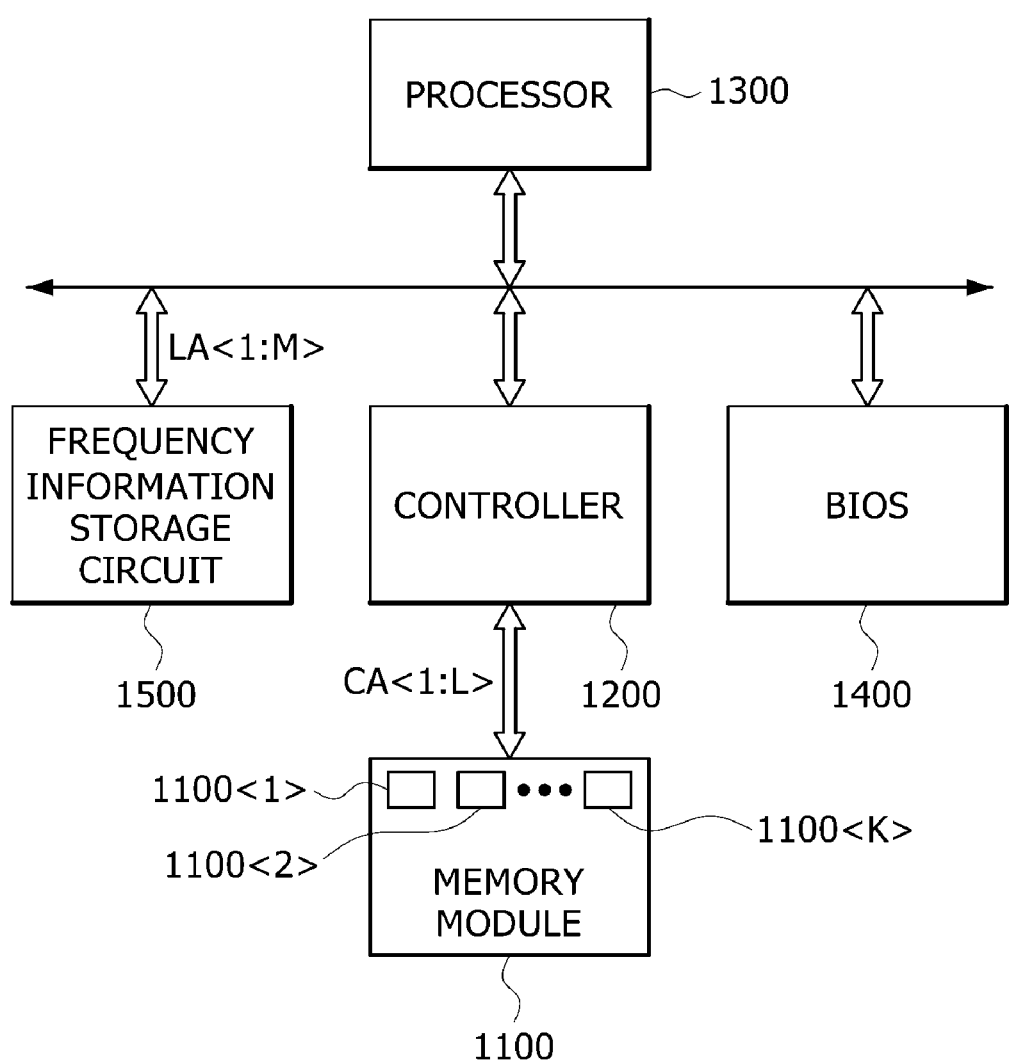
FIG. 8 is a block diagram illustrating a configuration of an electronic system employing the electronic device illustrated in FIG. 1.

The electronic device 100 described with reference to FIGS. 1 to 7 may be applied to an electronic system that includes a memory system, a graphic system, a computing system, a mobile system, or the like. For example, as illustrated in FIG. 8, an electronic system 1000 according an embodiment may include a memory module 1100, a controller 1200, a processor 1300, a basic input and output system (BIOS) 1400 and a frequency information storage circuit 1500.

The memory module 1100 may receive the external control signal CA<1:L> outputted from the controller 1200 to perform the mode register set operation, the first mode operation and the second mode operation which are described with reference to FIGS. 1 to 7. The memory module 1100 may include first to $K^{th}$ electronic devices 1100<1:K>. Each of the first to $K^{th}$ electronic devices 1100<1:K> may be realized to have substantially the same configuration as the electronic device 100 illustrated in FIG. 1. Each of the first to $K^{th}$ electronic devices 1100<1:K> may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The controller 1200 may output the external control signal CA<1:L> to the memory module 1100 so that the memory module 1100 performs the mode register set operation, the first mode operation and the second mode operation according to control of the processor 1300 and the BIOS 1400.

The processor 1300 may turn over a system controllability to the BIOS 1400 so that the memory module 1100 performs the mode register set operation, the first mode operation and the second mode operation at each frequency in the event that a system frequency varies. The BIOS 1400 may control an operation for applying the external control signal CA<1:L> outputted from the controller 1200 to the memory module 1100 so that the memory module 1100 performs the mode register set operation, the first mode operation and the second mode operation at each frequency.

The frequency information storage circuit 1500 may receive and store the latch address LA<1:M> generated by the mode register set operation, the first mode operation and the second mode operation at each frequency.

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to the electronic device 100 described above, the mode register set operation for storing the selection information signal OP_SEL into the register 62 using mode information stored in the cell array 92 may be performed relatively fast to enhance an operation speed of the electronic device 100. In addition, the electronic device 100 may promptly perform an operation suitable for each frequency using mode information stored in the cell array 92 according to various operation frequencies.

What is claimed is:
1. An electronic device comprising:
an information signal storage circuit configured to store an information signal during a mode register set operation, and configured to output the stored information signal as a mode register information signal;
a write data selection circuit configured to receive the mode register information signal and input data and output selectively the mode register information signal or input data as write data; and
a cell array configured to store the write data,
wherein, during a first mode operation, the write data selection circuit receives the mode register information signal, outputs the mode register information signal as the write data to the cell array, and the cell array stores the write data, within the cell array, which corresponds to one of combinations of an address signal,
wherein the information signal storage circuit includes a register,
wherein the register is configured to store a selection information signal, in response to an internal control signal, and
wherein the register is configured to output the stored selection information signal as the mode register information signal; and
wherein the information signal comes from an external source, the address signal comes from an external source and, the first mode operation corresponds to a command received from an external source.

2. The electronic device of claim 1, wherein the information signal is generated by decoding an external control signal.

3. The electronic device of claim 2, wherein the external control signal includes a command and an address.

4. The electronic device of claim 1,
wherein the internal control signal is generated from a mode register set command and the mode register write signal.

5. The electronic device of claim 4, wherein the selection information signal is generated from the information signal during the first mode operation.

6. The electronic device of claim 5, wherein the selection information signal is generated from read data during a second mode operation for outputting data stored in the cell array as the read data.

7. The electronic device of claim 1, wherein a mode command and a selection signal are enabled during the first mode operation.

8. The electronic device of claim 7, wherein the write data selection circuit is configured to output the mode register information signal or input data as the write data in response to the selection signal.

9. The electronic device of claim 8, wherein the input data is generated by buffering and latching external data.

10. The electronic device of claim 7, further comprising an address latch which is configured to latch the address signal to generate a latch address in response to the mode command.

11. The electronic device of claim 10, wherein the address latch is configured to latch the address signal if the mode command is generated and is configured to output the latched address signal as the latch address at a point of time that a predetermined delay time elapses from a point of time that the mode command is generated.

12. An electronic device comprising:
a write data selection circuit configured to output selectively input data or a mode register information signal as write data based on a first selection signal;
a cell array configured to receive the write data from the write data selection circuit and store the write data within the cell array;
a selection information signal generation circuit configured to generate a selection information signal from read data outputted from the cell array or an information signal based on a second selection signal, and
a register configured to store the selection information signal, in response to an internal control signal, and output the stored selection information signal as the mode register information signal, wherein, during a first mode operation, the write data selection circuit receives the mode register information signal, outputs the mode register information signal as the write data to the cell array, and the cell array stores the write data within the cell array, which correspond to one of combinations of an address signal;
wherein the mode register information signal is generated from the selection information signal, and the mode register information signal is generated from the information signal during a mode register set operation; and
wherein the information signal comes from an external source, the address signal comes from an external source and, the first mode operation corresponds to a command received from an external source.

13. The electronic device of claim 12,
wherein the first selection signal is enabled during a first mode operation; and
wherein the write data is generated from the mode register information signal and is stored into the cell array if the first mode operation is performed.

14. The electronic device of claim 12,
wherein the information signal is generated by decoding an external control signal, and
wherein the mode register set operation is performed so that the selection information signal, including the information signal, is stored within the electronic device.

15. The electronic device of claim 12,
wherein the second selection signal is enabled during a second mode operation; and
wherein data stored in the cell array are outputted as the read data if the second mode operation is performed.

16. The electronic device of claim 12, wherein, the internal control signal is generated from a mode register set command and the mode register write signal.

17. The electronic device of claim 12, further comprising an address latch which is configured to latch the address signal to generate a latch address in response to a mode command generating the first selection signal.

18. The electronic device of claim 17, wherein the address latch is configured to latch the address signal if the mode command is generated and is configured to output the latched address signal as the latch address at a point of time that a predetermined delay time elapses from a point of time that the mode command is generated.

* * * * *